(12) United States Patent
Limbacher et al.

(10) Patent No.: US 9,451,728 B2
(45) Date of Patent: Sep. 20, 2016

(54) EXPLOSION PROTECTION HOUSING HAVING AN EXPANDED AMBIENT TEMPERATURE RANGE

(75) Inventors: Bernd Limbacher, Schwäbisch Hall (DE); Wolf Hermann, Öhringen (DE); Jürgen Poidl, Kocherstetten (DE); Johannes Rückgauer, Nagelsberg (DE)

(73) Assignee: R. Stahl Schaltgeräte GmbH, Waldenburg (DE)

( * ) Notice: Subject to any disclaimer, the term of this patent is extended or adjusted under 35 U.S.C. 154(b) by 305 days.

(21) Appl. No.: 13/637,696

(22) PCT Filed: Mar. 23, 2011

(86) PCT No.: PCT/EP2011/054489
§ 371 (c)(1),
(2), (4) Date: Jan. 9, 2013

(87) PCT Pub. No.: WO2011/124475
PCT Pub. Date: Oct. 13, 2011

(65) Prior Publication Data
US 2013/0201627 A1    Aug. 8, 2013

(30) Foreign Application Priority Data
Mar. 29, 2010  (DE) .................. 10 2010 013 313

(51) Int. Cl.
*H05K 7/20*    (2006.01)
*H02B 1/28*    (2006.01)
(Continued)

(52) U.S. Cl.
CPC .......... *H05K 7/20418* (2013.01); *H02B 1/28* (2013.01); *H02B 1/56* (2013.01); *H05K 5/04* (2013.01); *H05K 7/20* (2013.01); *H05K 7/20218* (2013.01); *H05K 7/20281* (2013.01)

(58) Field of Classification Search
CPC .................................................. H05K 7/20418
USPC ........... 361/679.01; 312/223.2; 174/50, 50.5, 174/520
See application file for complete search history.

(56) References Cited

U.S. PATENT DOCUMENTS

| | | | | |
|---|---|---|---|---|
| 2,583,906 | A | * | 1/1952 | Guilder ..................... B01L 7/00 165/104.34 |
| 5,603,220 | A | * | 2/1997 | Seaman .......................... 62/3.7 |
| 5,692,556 | A | * | 12/1997 | Hafner ............... G05D 23/1919 165/301 |

(Continued)

FOREIGN PATENT DOCUMENTS

| | | |
|---|---|---|
| CN | 2 678 237 Y | 2/2005 |
| CN | 201 577 020 U | 9/2010 |

(Continued)

OTHER PUBLICATIONS

John Logothetis, H.P. Cohen, Constant Temperature Explosion-Proof Cabinet for Development of Two-Dimensional Chromatograms, Sep. 1959, Anal. Chem., 31 (9), pp. 1601-1602.*

(Continued)

*Primary Examiner* — Adrian S Wilson
(74) *Attorney, Agent, or Firm* — Leydig, Voit & Mayer, Ltd.

(57) ABSTRACT

An explosion protection housing constructed according to an explosion protection requirement having a temperature control system. The temperature control system includes a temperature control device that includes a pipe coil thermally connected to at least one of the walls of the housing. Optionally, temperature control fluid is directed through the pipe coil by means of circulating pump in order to increase or decrease the temperature of the housing, depending upon the explosion protection requirements.

17 Claims, 1 Drawing Sheet

(51) Int. Cl.
*H02B 1/56* (2006.01)
*H05K 5/04* (2006.01)

(56) References Cited

U.S. PATENT DOCUMENTS

| | | | |
|---|---|---|---|
| 5,954,127 A * | 9/1999 | Chrysler et al. | 165/170 |
| 6,141,217 A * | 10/2000 | Nakahama | H05K 7/20145 165/104.33 |
| 6,293,107 B1 * | 9/2001 | Kitagawa et al. | 62/3.6 |
| 6,330,152 B1 | 12/2001 | Vos et al. | |
| 6,384,380 B1 * | 5/2002 | Faries et al. | 219/385 |
| 6,401,462 B1 * | 6/2002 | Bielinski | 62/3.7 |
| 8,331,086 B1 * | 12/2012 | Meissner | 361/679.5 |
| 8,438,862 B2 * | 5/2013 | Oman et al. | 62/3.61 |
| 8,490,413 B2 * | 7/2013 | Blackway et al. | 62/3.62 |
| 8,512,430 B2 * | 8/2013 | Manahan et al. | 55/482 |
| 2004/0008483 A1 | 1/2004 | Cheon | |
| 2005/0029881 A1 * | 2/2005 | Preston | H05K 11/33 310/88 |
| 2007/0285889 A1 | 12/2007 | Watson et al. | |
| 2010/0288467 A1 | 11/2010 | Manahan et al. | |

FOREIGN PATENT DOCUMENTS

| | | |
|---|---|---|
| DE | 18 95 088 U | 6/1964 |
| DE | 44 13 128 A1 | 10/1995 |
| EP | 0 036 384 A2 | 9/1981 |
| FR | 2 807 285 A1 | 10/2001 |

OTHER PUBLICATIONS

European Patent Office, International Search Report in International Patent Application No. PCT/EP2011/054489.

Logothetis, John et al., "Constant Temperature Explosion-Proof Cabinet for Development of Two-Dimensional Chromatograms", Analytical Chemistry, vol. 31, Issue 9, pp. 1601 and 1602, Sep. 1959.

Office Action issued May 5, 2016, in Chinese Patent Application No. 201180017434.7, filed Mar. 23, 2011 (w/ English-language translation).

* cited by examiner

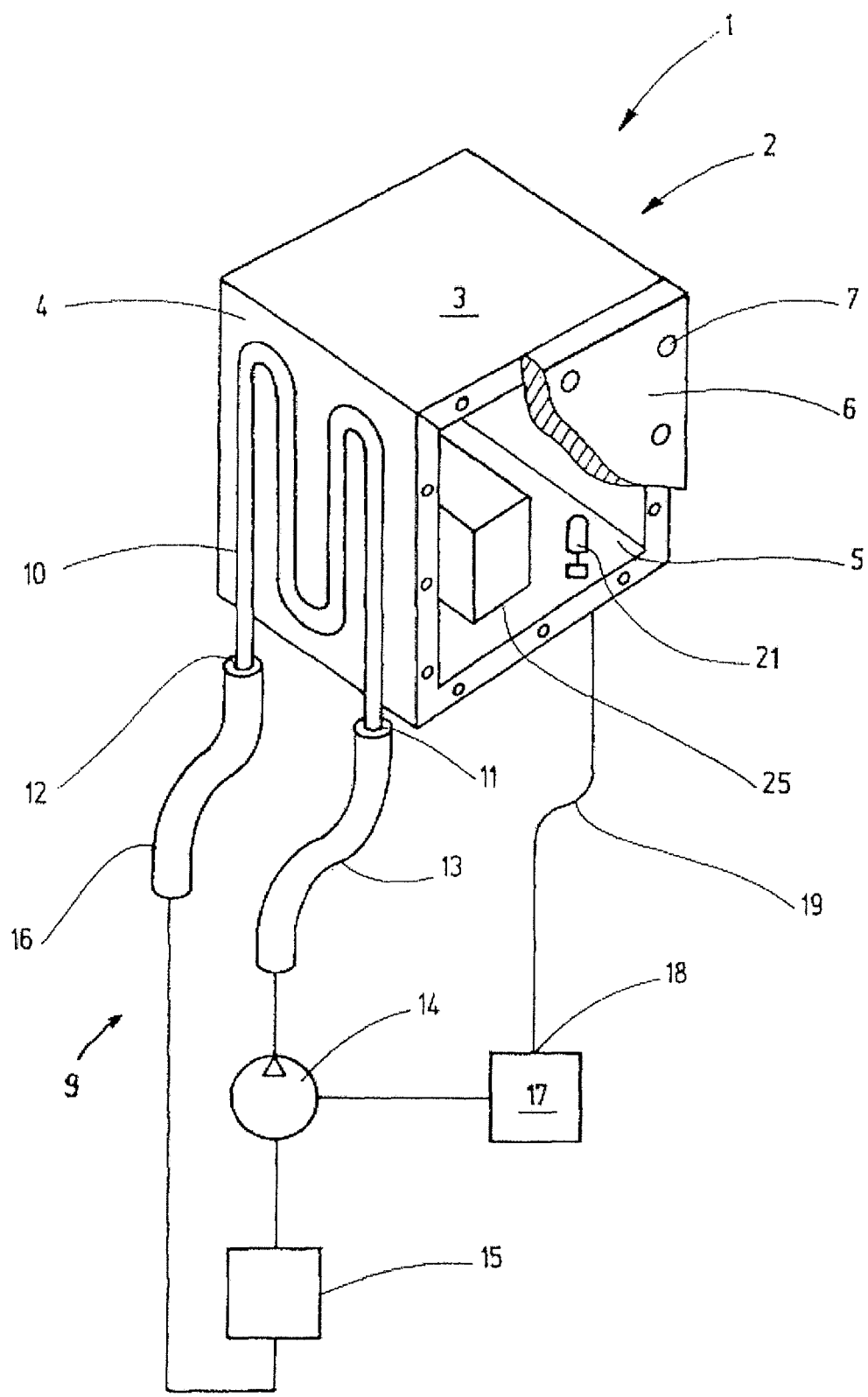

EXPLOSION PROTECTION HOUSING HAVING AN EXPANDED AMBIENT TEMPERATURE RANGE

CROSS-REFERENCE TO RELATED APPLICATIONS

This patent application is the national phase of PCT/EP2011/054489, filed Mar. 23, 2011, which claims the benefit of German Patent Application No. DE 10 2010 013 313.2, filed Mar. 29, 2010, which is incorporated by reference.

FIELD OF THE INVENTION

The present invention relates generally to explosion-protection housings, and more particularly, to an explosion-protection housing having a temperature control system.

BACKGROUND OF THE INVENTION

Housings that have to accommodate electrical equipment and must be operated in potentially explosive atmospheres have to meet requirements. These requirements define the explosion-proof maximum and minimum housing permissible temperatures. The minimum housing temperature is established because the strength properties of the materials of the housing change with decreasing temperature. Below certain temperatures, for example, below −60° C., the strength of an aluminum housing is no longer sufficient to withstand explosions inside the housing.

Furthermore, the gas quantity inside the housing increases with decreasing temperature. The increased gas quantity increases the gas pressure if an explosion occurs inside the housing which can cause the housing to burst.

In addition, surfaces exposed to potentially explosive substances are potential ignition sources. The ignition hazard originating from them is influenced by the ignition temperature of the potentially explosive substance and the surface temperature. The maximum permissible temperature is determined as a function of the potentially explosive environment for which the housing is configured. The functional aspect includes the compliance with the specified temperatures for use of the components.

The maximum housing temperature is less a question of the housing material or the gas quantity, but it is more a question of heat removal outward from the electrical equipment inside the housing through the housing wall. Unless special cooling means are provided, the electrical equipment inside the housing is only cooled by the convection or heat conduction to the housing walls. If the housing walls have an excessively high temperature, there is a risk of the contained electrical equipment becoming hotter than admissible. They themselves could overheat, or ignitable gas surrounding the housing or the components could be ignited.

OBJECTS AND SUMMARY OF THE INVENTION

The present invention relates to an improved housing that satisfies ignition protection requirements for a wider temperature range, and more particularly, a temperature range that is expanded both higher and lower.

For enlarging the temperature range upward, the housing is provided with a cooling device. Using a temperature sensor, the temperature of the housing is determined. The measured value is supplied to a control device that then optionally activates the cooling device when a critical temperature is reached.

This ensures that even under unfavorable conditions, for example, strong solar irradiation, the housing temperature is kept in a timely manner at values that prevent excessive heating of the electrical equipment inside the housing and ensure admissible surface temperatures. The cooling device does not have to be active at all times, and consequently uses energy only when cooling is truly needed.

On the other hand, for enlarging the ambient temperature range downwardly, the housing is provided with a heating device for at least one of the housing walls. Here too, the use of a temperature measuring device and a control device for the temperature measuring device ensures that the heating device is activated only if there is a risk that the admissible inner/housing temperature or the temperature of the contained component may not be reached.

The thermal devices can be connected directly to the housing walls or be located inside the housing so that they work together with the housing walls via an air gap. It is also conceivable to interconnect the heating and cooling devices in such a manner that at the extremes of the temperature range for the housing there is enlargement of both the upper and the lower admissible temperatures.

The temperature sensor can be configured as an NTC resistor or a radiation pyrometer. It can measure the air temperature in the housing. Alternatively, the temperature sensor or thermosensor may be connected directly to the wall of the housing so that no air gap remains in between. Which approach is better may depend upon the given application.

The heating or cooling device can be connected directly to the housing walls, either inside the housing or on the outside of the housing. The heating device and/or the cooling device can work with a heat transfer medium circulating through the heating and/or cooling device. The cooling device can also comprise a Peltier element that is attached outside on a housing wall, specifically at a site where good heat removal by way of the ambient air is possible.

A heating device can be implemented, for example, in the form of an electrical heating device having a resistance heating wire or in the form of an induction heater in which a ferromagnetic plate is attached to the housing wall in question and heated via turbulent flow losses.

The housing can be implemented in one of several possible ignition protection types including pressure-resistant encapsulation, increased safety, sand encapsulation, oil encapsulation, excess pressure encapsulation, and the like.

Other objects and advantages of the invention will become apparent upon reading the following detailed description and upon reference to the drawing.

BRIEF DESCRIPTION OF THE DRAWING(S)

FIG. 1 is a schematic of an explosion-protection housing having a temperature control system in accordance with the present invention.

While the invention is susceptible of various modifications and alternative constructions, certain illustrative embodiments thereof have been shown in the drawings and will be described below in detail. It should be understood, however, that there is no intention to limit the invention to the specific forms disclosed, but on the contrary, the intention is to cover all modifications, alternative constructions, and equivalents falling within the spirit and scope of the invention.

The following description of the FIGURE explains aspects for the understanding of the invention. Other undescribed details can be taken by the person skilled in the art in the usual manner from the drawings, which to that extent complete the description of the figures. It is clear that some deviations and combinations of the individual embodiment examples are possible.

The following drawings are not necessarily true to scale. To illustrate details, the size of some represented areas may be exaggerated. Moreover, the drawings are simplified for the purposes of the display and they do not contain every detail that may be present in a practical implementation. The terms "upper" and "lower" or "front" and "rear" relate to the normal position of use or to the terminology of explosion protected housings.

DETAILED DESCRIPTION OF THE PREFERRED EMBODIMENT

Referring now more particularly to the drawing, there is shown an illustrative explosion protection housing (1) constructed in accordance with an existing ignition protection category that satisfies explosion protection requirements. The illustrated housing includes a casing 2 with four side walls of which only side walls 3 and 4 are visible. An opening 5 facing the front, i.e. toward the viewer in FIG. 1, is closed with a cover 6. The cover 6 is screwed to the casing 2 with countersunk screws that cannot be seen. The screws are inserted into flat counter bores 7. The casing 2 and the cover 6 are made of metal, for example, aluminum die casting or welded steel plates, which are arranged, for example, on the margin surrounding the opening 5.

The illustrated housing 1 has a temperature control system 9. The temperature control system 9 in this case comprises a pipe coil 10 that is attached to the wall 4 facing toward the left as viewed in FIG. 1. The pipe coil 10 can be mounted with little heat transfer on the outer side of the wall 4. Alternatively, the pipe coil can be soldered or welded, for example, on the housing wall 4, in order to establish a good heat contact with the wall.

The pipe coil 10 comprises an inlet connection 11 and an outlet connection 12. The inlet connection 11 is connected via a hose or pipe system 13 to the output of a circulating pump 14 that is also part of the temperature control system 9. A suction side of the circulating pump 14 is provided with a temperature altering or control device 15 of the temperature control system 9 that, as is evident from the explanation below, may be configured either as a heating or as a cooling device. A feed side of the temperature altering or control device 15 is connected via an additional hose 16 to the outlet 12.

The operation of the pump 14 is controlled via a pump control device 17. The pump control device 17 in addition supplies the energy for operating the pump 14. The pump control device 17 has a control input 18 to which a temperature sensor 21 located inside the housing 1 is connected via a line 19.

With respect to one aspect of the invention, it is first assumed that the housing 1 is configured in the protection category "pressure-resistant encapsulation." The purpose of this is for the housing to prevent ignition sparks inside the housing 1 by ignitable gases that may be in the environment of the housing 1. The gap between the casing 2 and the cover 6 is therefore designed as a gap that is secure against ignition flashover. The cable feedthrough for connecting the temperature sensor 21 is configured in the ignition protection category "pressure-resistant encapsulation."

An ignition flashover-proof gap is not completely sealing, but rather, a gap exists through which a pressure compensation with respect to the outer atmosphere can take place. As a consequence, with decreasing temperature, an increasing quantity of gas from the environment reaches the interior of the housing 1. When considering the potential hazard, it is assumed that the gas is potentially ignitable. In that case, the greater the enclosed gas quantity, the greater the pressures generated in the event of an ignition.

To reduce the gas quantity, the temperature of the gas inside the housing 1 is determined using the temperature sensor 21. The latter communicates the temperature as an electrical signal to the control device 17. When the temperature in the housing 1 drops below a predetermined value, the control device 17 switches the circulating pump 14 on, which then pumps fluid through the pipe coil 10. The fluid is heated in the temperature altering or control device 15, and thus ensures that the wall 4 of the casing 2 also is heated. As a result, the temperature on the housing walls increases and the gas quantity inside the housing 1 is decreased in accordance with the temperature. The housing 1 is thus operated in a temperature range for which it is dimensioned. Due to the heating device, it is thus ensured that the housing can still be used, for example, beyond the minimum admissible casing temperature of −30° C., i.e. up to temperatures around −50° C., with the approval requirements of the casing still being satisfied.

As will be understood, the circulating pump 14 is switched off as soon as the temperature sensor 21 has measured a sufficient increase in the temperature to the desired value. The same also applies to the temperature control device 15, which is optionally also activated or deactivated via the control device 17.

The above explanations pertaining to a housing of the ignition protection category "pressure-resistant encapsulation" analogously also apply to a housing in the ignition protection category "sand encapsulation."

If the housing 1 is implemented in the ignition protection category "increased safety," devices are located inside the housing that inherently are in compliance with the ignition protection category "increased safety," or again other housings can be located in the housing, which themselves are implemented in the ignition protection category "pressure-resistant encapsulation." Such a housing is indicated schematically with 25. This housing 25 as well may be operated only in the ambient temperature range for which it has been approved. At lower temperatures, the gas quantity would again become excessively large, and it would not sufficiently withstand the pressure increase in the case of an explosion. To prevent this, a sufficiently high temperature must be ensured in the environment. This sufficiently high temperature is again achieved using the housing 1 and the temperature control system 9. If the temperature sensor 21 determines an excessively low ambient temperature for the housing 25, then, as described above, the temperature control device 15, i.e. heating device, is started. Fluid heated to appropriate temperatures is pumped by the circulating pump 14 through the pipe coil 10 to heat the housing 1.

In such case, the housing 1, in terms of the explosion-protected housing 25, behaves like a climate chamber that satisfies the requirements of explosion protection.

The modes of action of the two applications differ slightly from each other; however, the construction in both cases is basically the same. In the case of the housing 1 in the "pressure-resistant encapsulation" embodiment, it is advantageous if the pipe coil 10 is attached to the outside of the housing. As a result, implementation of the ignition protection category "pressure-resistant encapsulation" is avoided.

Using the described arrangement, the temperature range of the housing 1 cannot only be enlarged downward but also upward. In this case, the temperature system 9 works as a cooling device and cools the fluid circulating through the pipe coil 10 accordingly down, to remove heat from the housing 1. The activation of the cooling system again occurs as a function of the temperature determined by the temperature sensor 21. If the temperature in the housing 1 increases above an admissible limit value, the circulating pump 14 and the cooling device 15 are activated. The housing 1 is cooled, and thus heat is simultaneously removed from the interior of the housing 1. The surface temperature is thus kept within preset limits.

Such disadvantageous excess temperatures can occur, for example, if the housing is exposed to a particular solar irradiation. Similar conditions can also occur when the apparatuses contained in the air conditioned Ex-e-housing, accidentally generate a very large quantity of loss heat simultaneously.

In the case of a housing in the ignition protection category "increased safety," the pipe coil 10 can also be arranged inside the housing 1 without problem, because no particular feedthroughs are required. If the purpose is only to heat, it is also possible to heat the housing inductively, similar to an induction furnace.

The described arrangement thus provides a method to enlarge the temperature range upward and/or downward. For this purpose, a housing is provided, which is provided with a temperature control system. Depending on the temperature in the housing, the temperature control system is started in the sense of cooling or heating. By heating, the ambient temperature range is enlarged downward, with the quantity of potentially explosive gas in the housing being kept at a low value. In the case of cooling, an air conditioned environment is achieved for the parts that are located in the housing and generate loss heat. The admissible surface temperatures of the components of the housing 1 can also be respected. It will be understood that cooling is not limited to a housing of the ignition protection category "increased safety;" which housing type is only mentioned as an example. Housings in the ignition protection categories "pressure-resistant encapsulation," "sand encapsulation," "oil encapsulation," or "excessive pressure encapsulation" are also possible.

The temperature sensor 21 also can either detect the gas temperature in the housing or it can be rigidly connected thermally to one of the housing walls to determine primarily the housing temperature.

From the foregoing, it can be seen that a housing, which has been implemented in an ignition protection category, is provided with a temperature control device. The temperature control device consists of a pipe coil that is connected thermally to at least one of the walls. Temperature control fluid is optionally led through the pipe coil via a circulating pump to increase or lower the temperature of the housing, depending on the application.

The invention claimed is:

1. An ignition protection housing assembly, comprising:
an external casing having a plurality of solid walls that define an internal compartment having an open side, and a cover disposed along the open side to enclose the internal compartment, wherein an air gap is defined along an interface between the cover and the walls of the casing, the air gap being configured to have a dimension that inhibits ignition flashover between the internal compartment and the environment,
a temperature sensor thermally and rigidly connected to one of the plurality of walls disposed to measure, and provide information indicative of, a temperature of the casing wall to which the temperature sensor is connected to a control device; and
a temperature altering device thermally connected to one of the plurality of walls and operating to change a temperature of the casing by conducting heat to or away from the plurality of walls in response to commands provided by the control device;
wherein the control device selectively activates and deactivates the temperature altering device for heating or cooling the casing by conductive heat transfer in response to temperatures determined by the temperature sensor.

2. The ignition protection housing of claim 1, wherein said temperature altering device is a cooling device for cooling the casing in response to activation by the control device.

3. The ignition protection housing of claim 1, wherein said temperature altering device is a heating device for heating the casing in response to activation by the control device.

4. The ignition protection housing of claim 1, wherein said temperature sensor is thermally connected to one of the casing walls without an air gap there between.

5. The ignition protection housing of claim 1, wherein said temperature sensor is supported in separated relation to the casing walls.

6. The ignition protection housing of claim 1, wherein the temperature altering device is connected without an air gap to an exterior surface of one of the casing walls.

7. The ignition protection housing of claim 1, wherein the temperature altering device includes a component located within the internal compartment of the casing.

8. The ignition protection housing of claim 1, wherein the temperature altering device is located in part within the internal compartment of the casing in separated relation to the walls thereof.

9. The ignition protection housing of claim 1, wherein the temperature altering device includes a plurality of tubular-shaped lines through which heat transfer fluid is transmitted, and wherein heat is added or removed from the casing by conduction between the casing, the tubular-shaped lines and the heat transfer fluid.

10. The ignition protection housing of claim 1, wherein the temperature altering device includes an electrical heating coil.

11. The ignition protection housing of claim 1, wherein the temperature altering device is an induction heater.

12. The ignition protection housing of claim 1, wherein the casing is constructed according to an ignition protection category.

13. The ignition protection housing of claim 12, wherein the casing is constructed in accordance with one of a "pressure-resistant encapsulation," "increased safety," "sand encapsulation," or "oil encapsulation" in ignition protection category.

14. The ignition protection housing of claim 1, wherein the temperature altering device includes a heat exchanger connected directly to one of the walls of the casing.

15. A method for controlling a temperature of an explosion protection housing, comprising:

providing the explosion protection housing, the explosion protection housing including an external casing with five side walls that define an interior space with an opening, and a cover connected to the side walls and disposed to close the opening such that interior space is enclosed, wherein the five side walls and the cover are made from a solid, plate metal material, wherein an air gap is formed between the sidewalls and the cover, the air gap being sufficient to arrest a flashover between the interior space and its environment;

providing a temperature altering device that is associated with the casing, the temperature altering device being connected to one of the five side walls such that heat may be transferred via conduction between the temperature altering device and the one of the five side walls that the temperature altering device is connected to;

sensing a temperature of the interior space of the casing, and;

controlling operation of the temperature altering device as a function of the temperature measured by the sensing device for adding or removing heat via conduction between the temperature altering device and the casing for maintaining the temperature of the casing within a preferred range.

16. The method of claim 15, wherein the method further comprises mounting a component of the temperature altering device on an exterior surface of one of the side walls of the casing, and heating or cooling the wall, and thus the casing, as a function of temperature measured by the temperature sensor.

17. The method of claim 15, further comprising mounting a component of the temperature altering device within the interior space of the casing directly onto a wall of the casing for heating or cooling the casing as a function of the temperature measured by the temperature sensor.

* * * * *